United States Patent [19]
Okuda et al.

[11] Patent Number: 5,589,281
[45] Date of Patent: Dec. 31, 1996

[54] STABILIZED CARBON CLUSTER CONDUCTING OR SUPERCONDUCTING MATERIAL, PROCESS FOR PRODUCING THE SAME, DEVICE USING CARBON CLUSTER, AND PROCESS FOR PRODUCING THE DEVICE

[75] Inventors: Nobuyuki Okuda; Takashi Uemura; Yoshinobu Ueba; Koji Tada; Kengo Ohkura; Hirokazu Kugai, all of Osaka, Japan

[73] Assignee: Sumitomo Electric Industries, Ltd., Osaka, Japan

[21] Appl. No.: 393,043

[22] Filed: Feb. 23, 1995

Related U.S. Application Data

[63] Continuation of Ser. No. 51,345, Apr. 23, 1993, abandoned.

[30]    Foreign Application Priority Data

| May 20, 1992 | [JP] | Japan | 4-127027 |
| Aug. 19, 1992 | [JP] | Japan | 4-220407 |
| Mar. 4, 1993 | [JP] | Japan | 5-043730 |

[51] Int. Cl.$^6$ ........................ B32B 9/00
[52] U.S. Cl. ............ 428/688; 428/209; 428/210; 428/930; 428/408; 505/238
[58] Field of Search ............... 430/58, 59, 71, 430/126; 429/44; 505/701, 702, 703, 704, 850, 220, 230, 232, 233, 235, 236, 237, 238, 239, 190, 191; 252/500, 518; 428/426, 688, 689, 408, 373, 364, 391, 930

[56]     References Cited

U.S. PATENT DOCUMENTS

| 4,960,751 | 10/1990 | Yamazaki | 505/1 |
| 5,079,218 | 1/1992 | Tanaka et al. | |
| 5,171,373 | 12/1992 | Hebard | 430/71 |
| 5,178,980 | 1/1993 | Mort | 430/71 |
| 5,196,396 | 3/1993 | Lieber | 505/1 |
| 5,223,479 | 6/1993 | McCauley Jr. | 505/1 |
| 5,277,996 | 1/1994 | Marchetti | 429/44 |

FOREIGN PATENT DOCUMENTS 20522807  1/1993  European Pat. Off. .

OTHER PUBLICATIONS

C & EN, Nov. 22, 1993, pp. 11–12, 15–18.

Zhao et al., J. Phys. Condens. Matter 4(1992) L513–L514.

Gu Zhennan et al., "Superconductivity in Sn–doped C60" Solid State Communications, Pergamon Press, Oxford, vol. 82, No. 3, Apr. 1992, pp. 167–170 (abstract; page 167).

*Primary Examiner*—Patrick J. Ryan
*Assistant Examiner*—Patrick Jewik
*Attorney, Agent, or Firm*—Sughrue, Mion, Zinn, Macpeak & Seas

[57]         ABSTRACT

A stabilized carbon cluster conducting material comprising (i) a core comprising a conducting or superconducting carbon cluster and (ii) a sheath covering the core; a device comprising a substrate having thereon a film of a conducting or superconducting carbon cluster covered with a protective film capable of substantially preventing permeation of oxygen and water in the atmosphere; and processes for producing the stabilized carbon cluster conducting material and the device.

3 Claims, 6 Drawing Sheets

STABILIZED CARBON CLUSTER CONDUCTING OR SUPERCONDUCTING MATERIAL, PROCESS FOR PRODUCING THE SAME, DEVICE USING CARBON CLUSTER, AND PROCESS FOR PRODUCING THE DEVICE

This is a Continuation of application Ser. No. 08/051,345 filed Apr. 23, 1993, now abandoned.

FIELD OF THE INVENTION

The present invention relates to a stabilized carbon cluster conducting or superconducting material, a process for producing the same, a device using a carbon cluster conducting material, and a process for producing the device.

BACKGROUND OF THE INVENTION

It is known that a powder, thin film, etc. of carbon cluster molecules each composed of a plurality of carbon atoms linked to form a spherical shape or an ellipsoidal shape having a so-called fullerrenes structure, such as $C_{60}$ or $C_{70}$, is doped with an impurity atom, such as an alkali metal, to provide an organic conducting material or a superconducting material.

For example, a potassium-doped $C_{60}$ film and a rubidium-doped $C_{60}$ film have been reported to have conductivity of 500 S/cm and 100 S/cm, respectively (as described in *Nature*, Vol. 350, p. 320 (Mar. 28, 1991)).

It was also reported that potassium-doped $C_{60}$, $K_xC_{60}$, shows superconductivity at a critical temperature (hereinafter abbreviated as "Tc") of 18 K. from the results of microwave absorption and susceptibility measurements and at a Tc of 16 K. from the results of resistivity measurement (as described in *Nature*, Vol. 350, p. 600 (Apr. 18, 1991)) and that rubidium-doped $C_{60}$, $Rb_xC_{60}$, shows superconductivity at a Tc of 28 K. (as described in *Physical Review Letters*, Vol. 66, p. 2830 (1991). Cesium-doped $C_{60}$, $Cs_xC_{60}$, was reported to show superconductivity at a Tc of 30 K., and cesium- and rubidium-doped $C_{60}$, $Cs_2RbC_{60}$, was reported to show superconductivity at a Tc of 33 K. (as described in *Nature*, Vol. 352, pp. 222–223 (Jul., 18, 1991)).

Superconductivity of carbon clusters doped with Ca, an alkaline earth metal, or Sn, a group IVb metal, was also reported. That is, *Nature*, Vol. 355, p. 529 (Feb., 6, 1992) reported superconductivity of $Ca_5C_{60}$ at a Tc of 8.4 K., and *Solid State Commn.*, Vol. 82, No. 3, p. 167 (1992) reported superconductivity of a tin-doped $C_{60}/C_{70}$ mixture, $Sn_xC_{60}/C_{70}$, at a Tc of 37 K.

Further, the present inventors have ascertained that a carbon cluster doped with indium (In), a group IIIb element, can easily be obtained by simultaneous vacuum evaporation of indium and a carbon cluster by means of a vacuum deposition apparatus, an electron beam epitaxy (MBE) deposition apparatus, etc. and that the amount of the dopant In can be controlled simply by varying the rate of In deposition in the simultaneous vacuum evaporation so that fullerite conducting materials having an arbitrary conductivity, inclusive of from a nearly insulator to a semiconductor-like material, can be prepared with extreme ease and good reproducibility.

However, as has been well known, since an alkali metal element is highly reactive and instable, when a carbon cluster doped with an alkali metal element, e.g., K, Rb or Cs, is exposed to the atmosphere, the dopant element undergoes reaction with oxygen or water in the atmosphere and thereby escapes from the carbon cluster, resulting in disappearance of the above-mentioned characteristics in a short period of time.

This tendency is observed with a carbon cluster doped with other metal elements. For example, the present inventors have revealed that a powder of $C_{60}$ doped with Ca, an alkaline earth metal, loses its superconductivity when left in air for 1 hour. According to the literature cited above, the Sn-doped $C_{60}$ powder retains its superconductivity when allowed to stand in air for one day, but stability over a longer time remains unclear. The present inventors have additionally revealed that an In-doped $C_{60}$ film also loses its characteristics in air within a short time.

A currently widespread means for prevention of deterioration of metal element-doped carbon clusters is to seal them in an inert gas atmosphere. For example, the doped cluster is put in a glass tube containing an inert gas, and the open end of the tube is heat sealed or sealed with an epoxy resin.

However, where the open end of a glass tube is heat sealed, the carbon cluster is likely to undergo deterioration by the heat of the heat sealing. Where sealing is conducted with an epoxy resin, the resin possibly undergoes cracking by changes in environmental temperature due to the difference in thermal expansion coefficient between glass and the resin. If once a crack occurs, oxygen or water in air is no more prevented from entering the glass tube, and deterioration of characteristics cannot be avoided.

Besides, a carbon cluster once sealed into a glass tube as described above is difficult to be integrated into a device because of the difficulty in connecting to outer wiring.

SUMMARY OF THE INVENTION

An object of the present invention is to provide a stabilized carbon cluster conducting or superconducting material which has excellent chemical stability and does not readily undergo a reduction in conductivity in air.

Another object of the present invention is to provide a stabilized carbon cluster conducting or superconducting material which retains its characteristics for an extended period of time even when used in the atmosphere as a wire or a cable and to provide a process for producing the same.

A further object of the present invention is to provide a device using a carbon cluster conducting or superconducting film which is prevented from deterioration and thereby retains satisfactory conducting or superconductivity for an extended period of time and to provide a process for producing such a device.

Other objects and effects of the present invention will be apparent from the following description.

The present invention relates to a stabilized carbon cluster conducting material comprising (i) a core comprising a conducting or superconducting carbon cluster and (ii) a sheath covering the core.

The present invention also relates to a process for producing a stabilized carbon cluster conducting material comprising the steps of: filling a sheath with a mixture comprising a carbon cluster and a dopant; and subjecting the sheath filled with the mixture to a doping treatment.

The present invention further relates to a device comprising a substrate having thereon a film of a conducting or superconducting carbon cluster covered with a protective film capable of substantially preventing permeation of oxygen and water in the atmosphere.

The present invention still further relates to a process for producing a device comprising a substrate having thereon a film of a conducting or superconducting carbon cluster covered with a protective film, the process comprising the steps of:

depositing a carbon cluster on a substrate while adding a dopant to form a carbon cluster conducting or superconducting film on a substrate; and forming a protective film impermeable to oxygen and water in the atmosphere to cover the carbon cluster conducting or superconducting film.

DETAILED DESCRIPTION OF THE INVENTION

Figure 1:
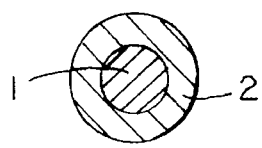
FIGS. 1 to 5 each illustrates a section of a stabilized carbon cluster conducting or superconducting material according to one embodiment of the present invention.
Figure 2:
Figure 3:
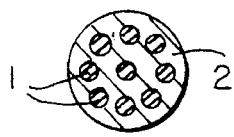
Figure 4:
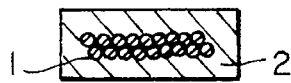
Figure 5:
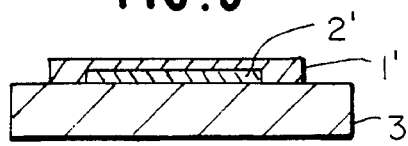

The carbon cluster which can be used in the present invention is represented by $C_{2n}$, wherein $10 \leq n \leq 100$, and has aromatic character, namely, a $\pi$-electron conjugated system. For example, carbon cluster $C_{60}$ is a molecule composed of 60 carbon atoms linked to have a soccer ball shape. The carbon cluster can be prepared by subjecting graphite or carbon to an arc discharge, resistive heating, laser beam heating, magnetron sputtering, etc. to obtain soot and purifying the soot by solvent extraction, column chromatography and the like to a high purity of 99.9% or more.

Besides the highly purified $C_{60}$, low purity $C_{60}$, i.e., a $C_{60}/C_{70}$ mixture can also be used.

These carbon clusters generally manifest conductivity or superconductivity upon being doped with a dopant.

Examples of donors to be used as a dopant in the present invention include cations of alkali metals and alkaline earth metals (e.g., beryllium, magnesium, calcium, strontium, and barium); cations of transition metals (e.g., titanium, chromium, manganese, iron, cobalt, nickel, and copper); $NH_4^+$, and $PH_4^+$; and cations of metal elements belonging to the groups IIb, IIIa, IVa, Va, etc. of the periodic table (e.g., Zn, Cd, Mg, Al, Ga, In, Tl, Ge, Sn, Pb, Sb, and Bi).

Examples of acceptors to be used as a dopant in the present invention include at least one member selected from the group consisting of a trihalide ion (e.g., $I_3^-$, $Br_3^-$ or $IBr_3^-$), $AuI_2^-$, $AuBr_2^-$, $NO_3^-$, $BF_4^-$, $ClO_4^-$, $ReO_4^-$, $PF_6^-$, $AsF_6^-$, $Cl.H_2O$, $Cu(NCS)_2^-$, and $Cu[N(CN)_2]Br^-$. These acceptors may also used as a dopant.

Preferred examples of the dopant for the carbon cluster used in the stabilized carbon cluster conducting material according to the present invention include Group I elements, Group II elements, Group III elements, and Group IV elements. Among these, an alkali metal, an alkaline earth metal, a noble metal, In, and Sn are more preferably used for the stabilized carbon cluster conducting material, and K, Rb, Cs, Ca, Ba, Sr, Au, Ag, Cu, In, and Sn are particularly preferred.

Doping of the above-mentioned dopant into a carbon cluster can be performed by various known doping methods, such as a heating method, an electrolysis method or a gas phase method, selected according to the shape of the carbon cluster or other conditions. The electrolysis method includes an electrochemical oxidation-reduction method at a constant voltage or a constant current, with an electrochemical oxidation-reduction method at a constant voltage being preferred. The gas phase method includes vacuum diffusion and ion implantation.

Because of the particular structure of carbon clusters represented by $C_{2n}$, especially the soccer ball shape of $C_{60}$, the carbon cluster of the present invention is expected to have three-dimensional electric character and therefore promising for broadened applications without restrictions which have been associated with conventional organic conducting or superconducting materials due to their one-dimensional or two-dimensional electric character.

The concentration of the dopant is not particularly limited and varies depending on the kind of dopant, the required properties of the doped carbon cluster. In alkali metal-doped carbon clusters $M_xC_{60}$ where M is an alkali metal, x is preferably from 1 to 5, and the doped carbon cluster exhibits superconductivity when x is 3. In indium-doped carbon clusters $In_xC_{60}$, x is preferably from 1 to 20, and more preferably from 5 to 6.

Of the doped carbon clusters of the present invention, some of alkali metal-doped ones, for example, Rb- or Cs-doped ones, have a Tc exceeding 30 K. In particular, $CsRbC_{60}$ shows current density of the order of $10^6$ A/cm$^2$.

Carbon clusters doped with a transition metal, such as Fe or Cr, are also expected useful as a magnetic material.

By using a transition metal element other than alkali metals and alkaline earth metals, e.g., the metal element of Group IIb, IIIa, IVa or Va of the periodic table, as a dopant, there are obtained carbon cluster conducting materials or superconducting materials which are much more stable in air than the alkali metal- or alkaline earth metal-doped $C_{60}$ conducting materials or superconducting materials.

The stabilized carbon cluster conducting material or superconducting material according to the present invention comprises the above-mentioned doped carbon cluster as a core and a sheath made of various metals or non-metallic substances such as insulators and thereby withstands long-term use in air.

In particular, an Sn-doped $C_{60}$ superconducting material as a core is capable of providing a superconducting wire or cable which has a Tc as high as 37 K and displays isotropic characteristics in a magnetic field.

Examples of the metals used as a sheath include so-called synthetic metals, such as conductive high polymers and graphite, as well as general metals, e.g., copper, silver, nickel, and stainless steel. Examples of the insulators used as a sheath include glass, quartz, ceramics, diamond, and various high polymers. Metals as a sheath material not only bring about chemical stabilization of the carbon cluster superconducting material but serve as stabilizing materials which act as a bypass for an overcurrent in case of destruction of the superconducting state. In particular, copper or silver as a sheath material is effective for stabilization of superconductivity.

The thickness of the sheath can appropriately determined depending on the material of the sheath and the shape of the carbon cluster conducting or superconducting material as a final product, so that oxygen or water in the air is prevented from entering in the doped carbon cluster. The thickness of the sheath may be from less than 1 µm to several mm, and a further thicker sheath may be employed.

Where the final carbon cluster conducting or superconducting material is a superconducting wire, the sheath is preferably a conductor, and the ratio of the sectional area of the superconducting carbon cluster core and that of the sheath can be appropriately determined according to a conventional manner known in the art of superconducting wires.

Where the final carbon cluster conducting or superconducting material is a device, an insulator (dielectric material) is preferably used as a sheath (protective film). If the device is those utilizing interactions to magnetic fields or electromagnetic waves, e.g., a superconductive quantum interference device (SQUID) and a high frequency antenna, the thickness of the sheath is generally from less than 1 µm to several µm.

The above-mentioned stabilized carbon cluster conducting material according to the present invention can be produced by thoroughly mixing and grinding a starting carbon cluster and a dopant, filling a sheath with the mixture, and subjecting the core/sheath structure to a doping treatment, e.g., a heat treatment, to perform doping. Before the heat treatment, the sheath filled with the core material may be evacuated to $10^{-6}$ Torr to remove the inside traps. The heat treatment for doping may be followed by pressing or wire drawing to produce wires, cables and the like.

The heat treatment is carried out at a temperature ranging from 400° to 800° C., which is higher than the temperature having conventionally been applied to an alkali metal doping, i.e., about 390° C., for a period of from about 60 hours to about 30 days.

The shape of the carbon cluster conducting or superconducting material as a final product is not particularly limited, and examples thereof includes wires having a circular section, flat wires, multi-core wires, twisted wires, films, sheets, fabrics, rods, plates, spheres, fine particles, fibers, and thin films formed on a substrate to form a device.

Since the stabilized carbon cluster conducting material of the present invention has a conducting or superconducting carbon cluster doped with, a dopant, e.g., an alkali metal, etc. covered with a sheath, the doped carbon cluster as a core is prevented from contacting with oxygen or water in air and thereby protected from chemical denaturation.

Examples of the sectional structure of the stabilized carbon cluster conducting material are shown in FIGS. 1 through 5. In FIGS. 1 to 4, numbers 1 and 2 indicate a core and a sheath, respectively. The stabilized carbon cluster conducting material shown in FIG. 5 comprises substrate 3 having formed thereon thin film core 1' which is covered with sheath 2'.

In addition to the excellent stability in air, the stabilized carbon cluster conducting material of the present invention can be supplied in a wide variety of shapes, such as a wire, a multi-core wire, and a sheet, whereas the conventional carbon cluster conducting materials or superconducting materials were available only in the form of powder or a thin film.

Accordingly, the stabilized carbon cluster conducting materials of the present invention are of high industrial value as conducting or superconducting materials of light weights available in a variety of forms in the fields of, for example, electromagnetic shields, magnetic shields, bearings, magnet, various wires, and sensors.

The device using a carbon cluster film according to the present invention is characterized by a structure comprising a substrate having formed thereon a conducting or superconducting carbon cluster film, at least the carbon cluster film being covered with a protective film substantially impermeable to oxygen and water in the atmosphere.

According to this structure, the dopant in the carbon cluster film is prevented from reacting with oxygen or water in the atmosphere so that the characteristics of the carbon cluster film can be retained in a stable manner for a prolonged period of time.

Because the carbon cluster molecule is a π-electron conjugated molecule and thereby more reactive than inorganic substances, e.g., GaAs semiconductors, it permits modification with various functional groups, by which a variety of characteristics would be given to the carbon cluster film.

The above-mentioned device of the present invention can be produced by a process comprising the steps of:

depositing a carbon cluster on a substrate while adding a dopant to form a carbon cluster conducting or superconducting film on a substrate; and forming a protective film impermeable to oxygen and water in the atmosphere to cover the carbon cluster conducting or superconducting film.

The device of the present invention is preferably produced by a process comprising the steps of:

depositing a carbon cluster on a substrate while adding a dopant to form a carbon cluster conducting or superconducting film on a substrate;

depositing a carbon cluster on the carbon cluster conducting or superconducting film to form a carbon cluster film; and forming a protective film impermeable to oxygen and water in the atmosphere to cover the carbon cluster conducting or superconducting film and the carbon cluster film.

All the steps in the processes according to the present invention are preferably carried out in a continuous vacuum line without exposing the carbon cluster film formed on the substrate to the atmosphere.

By conducting all the steps in a continuous vacuum line, since both the carbon cluster film and the protective film are prevented from contact with the atmosphere, there is obtained a device with satisfactory characteristics. Further, a protective film formed in vacuo can have a dense structure thereby effectively interferes with permeation of oxygen or water.

Preferred examples of the dopant for the carbon cluster used in the device according to the present invention include Group I elements, Group II elements, Group III elements, and Group IV elements. Among these, an alkali metal, an alkaline earth metal, a noble metal, In, and Sn are more preferably used for the device, and K, Rb, Cs, Ca, Ba, Sr, Au, Ag, Cu, In, and Sn are particularly preferred.

Since the carbon cluster film is formed by simultaneous deposition of the carbon cluster and the dopant, the amount of the dopant can easily be controlled simply by varying the rate of dopant deposition. As a result, a carbon cluster film having arbitrary conductivity, inclusive of from a nearly insulator to a semiconductor-like material, can be obtained with extreme ease and good reproducibility.

The protective film preferably comprises an insulator having a coefficient of thermal expansion close to that of the carbon cluster film. For example, considering that an alkali metal- or indium-doped carbon cluster film has a thermal expansion coefficient of $3 \times 10^{-6}$/°C., an insulator having a thermal expansion coefficient ranging from $1 \times 10^{-6}$ to $5 \times 10^{-6}$/°C. are preferred. Examples of such an insulator includes silicon ($2.6 \times 10^{-6}$/°C.), silicon dioxide ($SiO_2$) (2.9 to $3.2 \times 10^{-6}$/°C.), silicon nitride ($Si_3N_4$) ($1.3 \times 10^{-6}$/°C.), diamond ($1.0 \times 10^{-6}$/°C.), amorphous carbon ($1.0 \times 10^{-6}$/°C.), and boron nitride ($1.8 \times 10^{-6}$/°C.). The closeness between these materials and the doped carbon cluster film in thermal expansion coefficient eliminates the fear of cracking in the protective film when used in a low temperature or high temperature condition. That is, the protective film exhibits sufficient durability against thermal shocks enough to avoid troubles due to cracks, such as permeation of oxygen or water into the carbon cluster film. Retention of the characteristics of the device can thus be further improved.

The protective film of silicon or an oxide or nitride thereof can be formed by MBE deposition, CVD in a vacuum system, plasma CVD, sputtering, etc.

The thickness of the carbon cluster film is generally from 100 to 1,000 nm, and the thickness of the protective film is from 0.1 to 10 μm.

Figure 6:
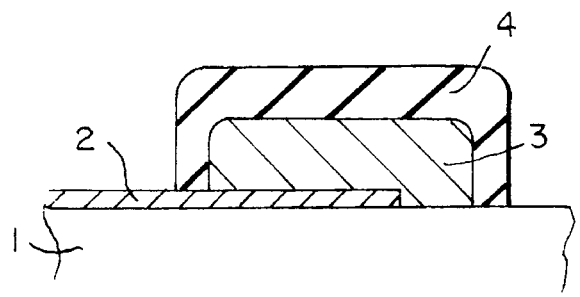
FIG. 6 illustrates a cross section of a device using the carbon cluster superconducting film according to one embodiment of the present invention.

One embodiment of the process for producing a device of the present invention, in which an alkali metal-doped cluster film, is used is described below by referring to one example shown in FIG. 6.

Substrate 1 has formed thereon gold electrode pattern 2. Carbon cluster superconducting film 3 is formed on substrate 1 in contact with gold electrode 2. Carbon cluster film 3 in this example is composed of a carbon cluster doped with an alkali metal (R), $R_xC_{60}$. The alkali metal used herein includes rubidium (Rb) and potassium (K).

Carbon cluster film 3 is covered with insulating film 4 as a protective film. Insulating film 4 is designed so as to prevent permeation of oxygen and water in the atmosphere at room temperature. Specifically, insulating film 4 may have sufficient density or thickness enough to prevent permeation of oxygen or water. Further, insulating film 4 is made of a material whose coefficient of thermal expansion is close to that of carbon cluster film, i.e., $3 \times 10^{-6}$/°C., such as those enumerated above.

Carbon cluster film 3 being protected by insulating film 4, oxygen or water in the air is prevented from entering therein, whereby the alkali metal present in carbon cluster film 3 is kept away from reacting, and satisfactory superconductivity can be retained for a prolonged period of time.

Figure 7:
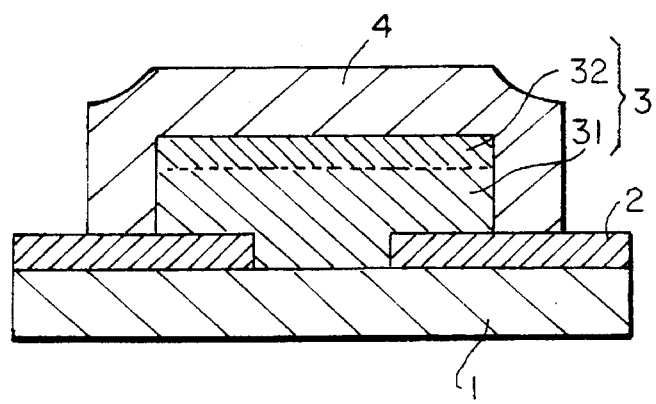
FIG. 7 illustrates a cross section of a device using the carbon cluster superconducting film according to one embodiment of the present invention.

Another embodiment of the process according to the present invention in which an indium-doped carbon cluster film, is described below by referring to an illustrative example shown in FIG. 7.

Gold electrode pattern 2 is formed on substrate 1. Carbon cluster film 3 is formed on substrate 1 in contact with gold electrode 2. Carbon cluster film 3 in this embodiment is composed of layer 31 comprising an indium-doped carbon cluster, $In_xC_{60}$, which is formed by simultaneous deposition of $C_{60}$ and indium and layer 32 solely comprising $C_{60}$ as an upper layer. $C_{60}$ layer 32 functions as a stress-absorbing layer between $C_{60}$/In layer 31 and protective film 4 hereinafter described. In other words, when protective film 4 is formed thereon, there are fears that the device constituting protective film 4, e.g., silicon, may enter $C_{60}$/In layer 31 and that thermal or physical stress may destroy the surface of $C_{60}$/In layer 31 to cause deterioration of its characteristics, leading to deterioration of the characteristics of the finally obtained device. Such troubles can be eliminated by providing $C_{60}$ layer 32. The thickness of $C_{60}$ layer 32 is generally from 100 to 50 nm.

Carbon cluster film 3 is covered with protective film 4. Protective film 4 is designed so as to prevent permeation of oxygen or water in the air at room temperature. Specifically, it may have sufficient density or thickness enough to prevent permeation of oxygen or water. Further, protective film 4 of this embodiment is made of silicon whose coefficient of thermal expansion is close to that of carbon cluster film 3.

Carbon cluster film 3 being protected by protective film 4, oxygen or water in the air is prevented from entering therein, whereby indium contained in carbon cluster film 3 can be kept in the condition equal to the stage immediately after doping. As a result, satisfactory characteristics can be retained for a prolonged period of time.

Figure 8:
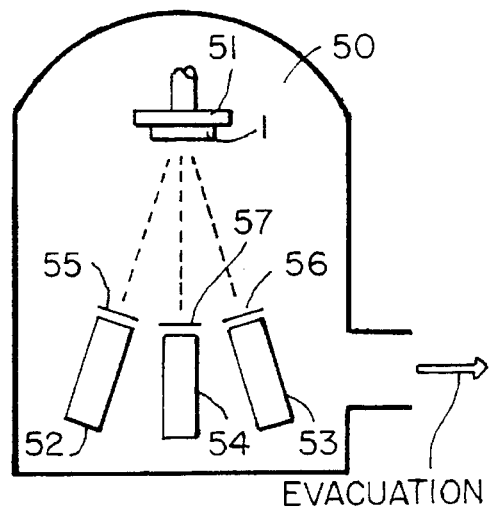
FIG. 8 is a schematic illustration of an MBE deposition apparatus which can be used for the production of the device according to the present invention.

In FIG. 8 is shown an MBE deposition apparatus which can be used for the production of the device according to the present invention. Substrate 1 is held on susceptor 51 in vacuum chamber 50 evacuated to about $10^{-7}$ to $10^{-9}$ Torr. Molecular beam source 52 for generating a molecular beam of $C_{60}$, molecular beam source 53 for generating a molecular beam of a dopant such as an alkali metal (e.g., rubidium) or indium, and molecular beam source 54 for generating a molecular beam of a protective layer-forming material such as silicon are provided to face substrate 1. Above each molecular beam source 52, 53 or 54 is set shutter 55, 56 or 57, respectively, with which generation of molecules is to be controlled. A molecular beam source for generating a molecular beam of $C_{60}$ or an alkali metal has a resistive heating element composed of a Knudesen cell, and that for generating a molecular beam of indium or silicon has an electron bombardment heating element composed of an electron gun.

Figure 10:
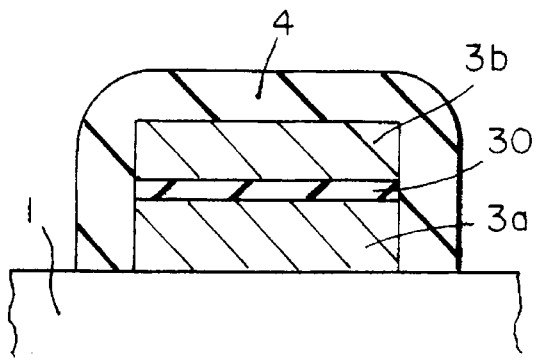
FIG. 10 illustrates a cross section of a Josephson junction device using the carbon cluster superconducting film according to the present invention.

The present invention can be applied to a Josephson junction device. In FIG. 10 is shown an example of a Josephson junction device to which the present invention is applied. A Josephson junction device can be produced by interposing insulating film 30 between a pair of carbon cluster superconducting films 3a and 3b. In this embodiment, insulating layer 30 can be formed in the same vacuum line by depositing a carbon cluster film $C_{60}$ with no doping of an alkali metal with shutter 55 open and shutters 56 and 57 closed.

In the production of such a Josephson junction device, since formation of carbon cluster superconducting films 3a and 3b can be carried out at a temperature not higher than 300° C., insulating layer 30 is not damaged during the formation of the upper superconducting film 3b. Accordingly, a satisfactory Josephson junction can be formed with a small thickness of insulating layer 30 to provide a high quality device. In addition, being protected by insulating film 4, carbon cluster superconducting films 3a and 3b maintain their superconductivity for an extended period of time.

Therefore, the Josephson junction device of FIG. 10 is useful as a SQUID or a high speed switching device for logic operation with computers.

The present invention will now be illustrated in greater detail with reference to Examples, but it should be understood that the present invention is not limited thereto.

EXAMPLE 1

A commercially available $C_{60}/C_{70}$ carbon cluster was purified by silica gel column chromatography using a hexane/benzene mixture (95/5 by volume) as an eluent to obtain purified $C_{60}$ carbon cluster.

Cesium (Cs), rubidium (Rb) and the $C_{60}$ carbon cluster were weighed at a molar ratio of 2/1/1 and sealed into a glass tube for doping in a gloved box equipped with an Ar-circulating cleaning device. The glass tube with the contents was set in a tubular furnace, where the glass tube was evaluated to $10^{-2}$ Torr, re-sealed, and heated at 390° C. for 3 days. The resulting $CsRbC_{60}$ was packed in a copper-made pipe in a gloved box, the pipe evacuated to $10^{-2}$ Torr, and the both ends were pressed and sealed by soldering.

The copper pipe filled with $CsRbC_{60}$ was fabricated by swaging to obtain a wire having an outer diameter of about 2 mm. As a result of measurement of D.C. magnetic susceptibility, superconductivity was observed at a Tc of 30° K. The wire underwent no change in Tc when allowed to stand in air for one month or longer.

EXAMPLE 2

Sn powder and the purified $C_{60}$ cluster powder were weighed at a molar ratio of 4/1, thoroughly mixed and ground in an argon atmosphere. The grinds were packed in a silver pipe, the pipe evacuated to $10^{-6}$ Torr, and the both ends of the pipe were pressed and sealed with silver solder. The pipe was heated at 600° C. for 10 days and rolled into a flat wire, followed by annealing at 600° C. for 10 days.

As a result of measurement of D.C. magnetic susceptibility, the resulting wire showed diamagnetism at Tc of 33 K. When allowed to stand in air for 1 month or longer, the wire underwent no change in Tc.

EXAMPLE 3

Figure 9A:
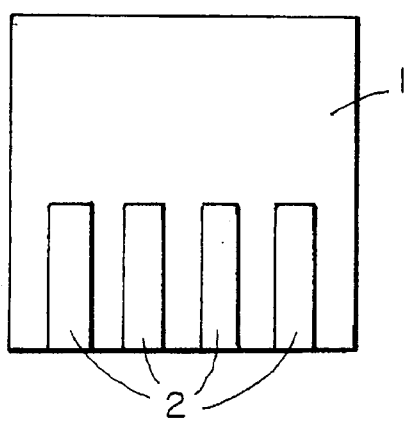
FIGS. 9-(a), (b) and (c) illustrate the steps for producing the device of FIG. 7.
Figure 9B:
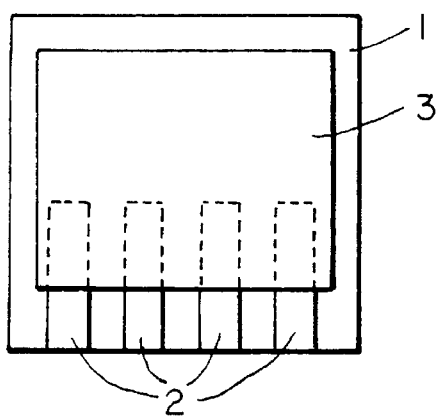
Figure 9C:
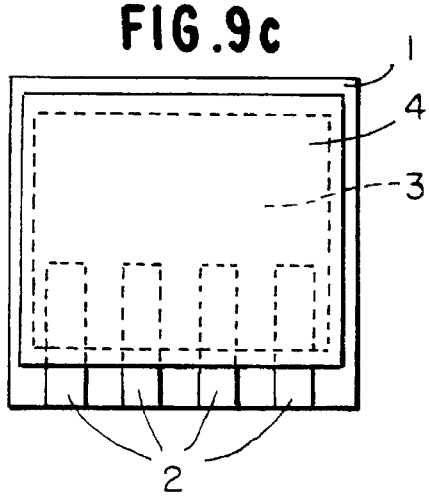

Silicon substrate 1 (plane orientation: (110)) having a dimension of 5 mm×5 mm with a thickness of 0.5 mm having previously formed thereon four gold electrodes 2 as shown in FIG. 9-(a) was set in the MBE deposition apparatus shown in FIG. 8. $C_{60}$ powder, an Rb alloy, and Si were put in molecular beam source 52, 53, and 54, respectively. Chamber 50 was evacuated to a degree of vacuum of about $10^{-8}$ Torr.

Carbon cluster $C_{60}$ and metallic rubidium were simultaneously evaporated from molecular beam sources 52 and 53, respectively, with shutters 55 and 56 open to form carbon cluster superconducting film 3 composed of an Rb-doped carbon cluster ($Rb_3C_{60}$) on substrate 1 as shown in FIG. 9-(b).

Silicon was then evaporated from molecular beam source 54 with shutter 57 open and shutters 55 and 56 closed to form insulating film 4 having a deposit thickness of 4,000 Å so that carbon cluster superconducting film 3 was covered therewith as shown in FIG. 9-(c). The resulting device had a cross section as shown in FIG. 6. Each gold electrode 2 extended out of insulating film 4.

The device was taken out in the air, and electric resistance was measured at a temperature of 4.2 to 100 K. with a four-terminal network. It was confirmed as a result that the device was transformed into a superconducting state at a temperature not higher than Tc of 30 K.

The same measurement on the device after being warmed to room temperature and allowed to stand in the atmosphere for 1 day revealed no change of the critical temperature.

Further, the device was subjected to a durability test against heat cycles between a liquid helium temperature and room temperature. As a result, no change in the critical temperature was observed even after 10 heat cycles. This indicates that the device suffers from no cracks even if cooled to a cryogenic temperature and is therefore protected from permeation of oxygen or water in the atmosphere into carbon cluster superconducting film 3.

It is thus seen that insulating film 4 comprising silicon effectively functions as a protective film for carbon cluster superconducting film 3 thereby to prevent a reduction of rubidium in superconducting film 3. That is, insulating film 4 inhibits permeation of oxygen and water in the atmosphere to assure retention of satisfactory superconductivity for an extended period of time. Such dense insulating film 4 can first be obtained by forming carbon cluster superconducting film 3 and insulating film 4 in a continuous vacuum line.

Further, the difference in coefficient of thermal expansion between Si and $Rb_3C_{60}$ is extremely small. More specifically, the coefficient of thermal expansion of Si is $2.5\times10^{-6}$/°C., and that of $Rb_3C_{60}$ is $3\times10^{-6}$/°C. That is, the coefficient of thermal expansion of insulating film 4 is practically equal to that of carbon cluster superconducting film 3 as well as that of substrate 1. It is understood accordingly that the device has sufficient durability against thermal shocks.

Furthermore, since gold electrodes 2 extend out of insulating film 4, terminals for testing electrical characteristics, etc. can be connected to these gold electrodes 2 in the atmosphere without causing deterioration of carbon cluster superconducting film 3.

EXAMPLE 4

A superconducting device was produced in the same manner as in Example 3, except for replacing silicon used as a material for insulating film 4 for protection of carbon cluster superconducting film 3 with diamond, amorphous carbon or boron nitride having a coefficient of thermal expansion of $1.0\times10^{-6}$/°C., $1.0\times10^{-6}$/°C. or $1.8\times10^{-6}$/°C., respectively, which is close to those of carbon cluster superconducting film 3 and silicon substrate 1.

Similarly to Example 3, the resulting devices each underwent no deterioration of the $Rb_3C_{60}$ film and exhibited sufficient durability against thermal shocks.

EXAMPLE 5

Figure 11A:
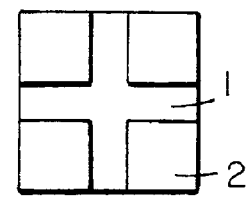
FIGS. 11-(a), (b) and (c) illustrate the steps for producing the device of FIG. 9.
Figure 11B:
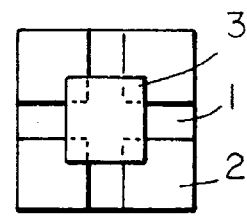
Figure 11C:
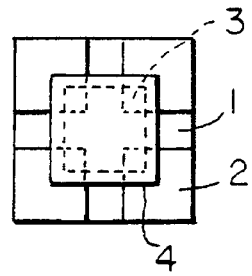

Quarts glass substrate 1 having a dimension of 10 mm×10 with a thickness of 0.5 mm having previously formed thereon four gold electrodes 2 as shown in FIG. 11-(a) was set on susceptor 51 of the MBE deposition apparatus of FIG. 8. To each gold electrode 2 was connected a terminal of an electric resistance measuring apparatus according to a four-terminal network method which was placed out of the deposition apparatus. $C_{60}$ powder, indium, and silicon were put in molecular beam sources 52, 53, and 54, respectively.

Chamber 50 was evacuated to a degree of vacuum of $10^{-7}$ to $10^{-8}$ Torr, and carbon cluster $C_{60}$ and indium were simultaneously evaporated from molecular beam sources 52 and 53 with shutters 55 and 56 open while monitoring the resistivity between 4 gold electrodes to form $C_{60}$/In layer 31 comprising an indium-doped carbon cluster, $In_xC_{60}$, having a thickness of 350 nm on substrate 1 kept at room temperature. The final resistivity of $C_{60}$/In deposit layer 31 in vacuo was 2 $\Omega \cdot cm$, which is a semiconductor-like resistivity.

Then, shutter 56 was closed to stop the evaporation of indium from molecular beam source 53, and evaporation of carbon cluster $C_{60}$ from molecular beam source 52 was continued to deposit $C_{60}$ layer 32 having a thickness of 200 nm on $C_{60}$/In layer 31 to form carbon cluster film 3 as shown in FIG. 11-(b).

Shutter 55 was closed to stop the evaporation of carbon cluster $C_{60}$ from molecular beam source 52 and, instead, shutter 57 was opened to evaporate silicon from molecular beam source 54. There was thus deposited silicon protective film 4 to a thickness of 600 nm with which carbon cluster film 3 was covered as shown in FIG. 11-(c). The resulting device had a cross section as shown in FIG. 7. Each gold electrode 2 extended out of protective film 4.

Figure 12:
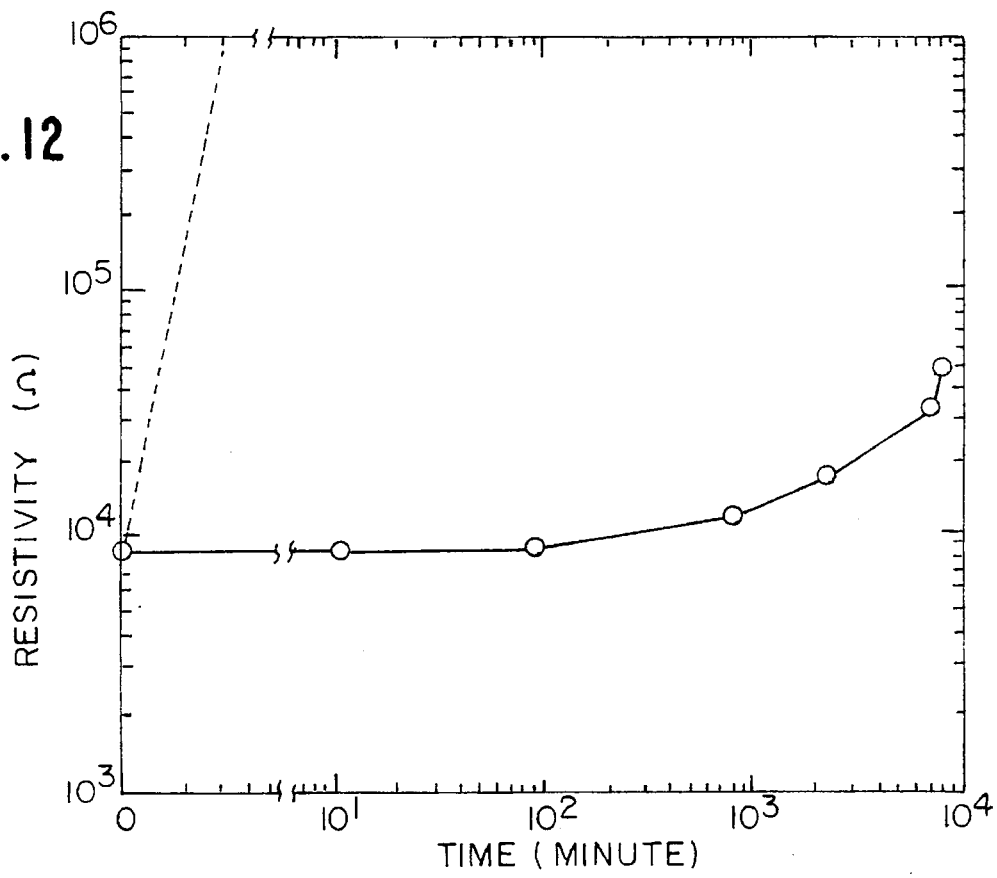
FIG. 12 is a graph of resistivity ($\Omega$) vs. time of the device obtained in Example 5.

The device was taken out in the atmosphere while continuing measuring the electric resistivity of $C_{60}$/In layer 31, and the measurement was further continued in the atmosphere. The results of the measurement are shown in FIG. 12 (solid line). The time was reckoned from the point at which the device was taken out. It is seen that the device retains a resistivity on the order of $k\Omega$ even after 9 days.

For comparison, a device was produced in the same manner as described above, except for forming no protective film 4. The results of the resistivity measurement in the atmosphere are also shown in FIG. 12 (broken line). It is seen that the resistivity abruptly increases in the atmosphere, reaching an order of $G\Omega$ within 5 minutes.

These results prove that covering of carbon cluster film 3 with protective film 4 effectively prevents permeation of oxygen and water of the atmosphere into carbon cluster film 3.

Figure 13:
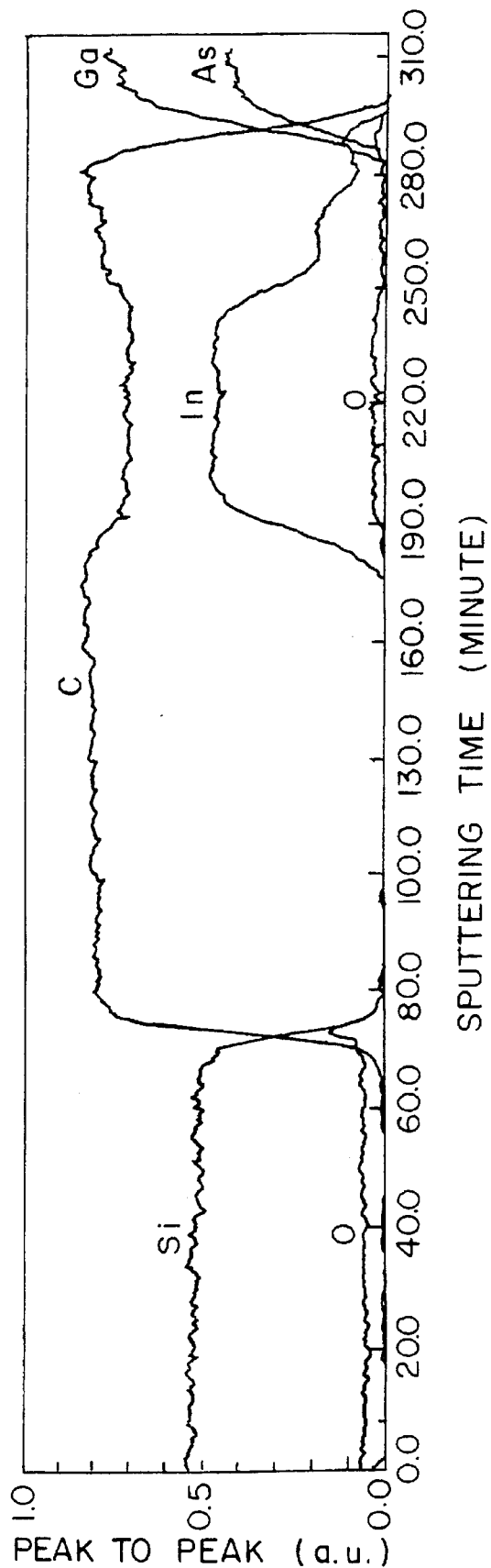
FIG. 13 is a composition profile of the device obtained in Example 5 in its thickness direction as measured by Auger electron spectroscopy.

The device of Example 5 was analyzed by Auger electron spectroscopy. In FIG. 13 is shown the composition profile of the device in its thickness direction (corresponding to the sputtering time) as obtained by the Auger electron spectroscopy. The profile pattern proves that $C_{60}$/In layer 31 has a composition of $In_{5-6}C_{60}$.

In $C_{60}$/In layer 31 of the device of Example 5, 1.4 oxygen atoms were detected per $C_{60}$ molecule. In the comparative device having no protective film 4, to the contrary, 6.2 oxygen atoms were detected per $C_{60}$ molecule in the $C_{60}$/In layer. These results also prove obviously the oxygen barrier effect of protective film 4.

Figure 14:
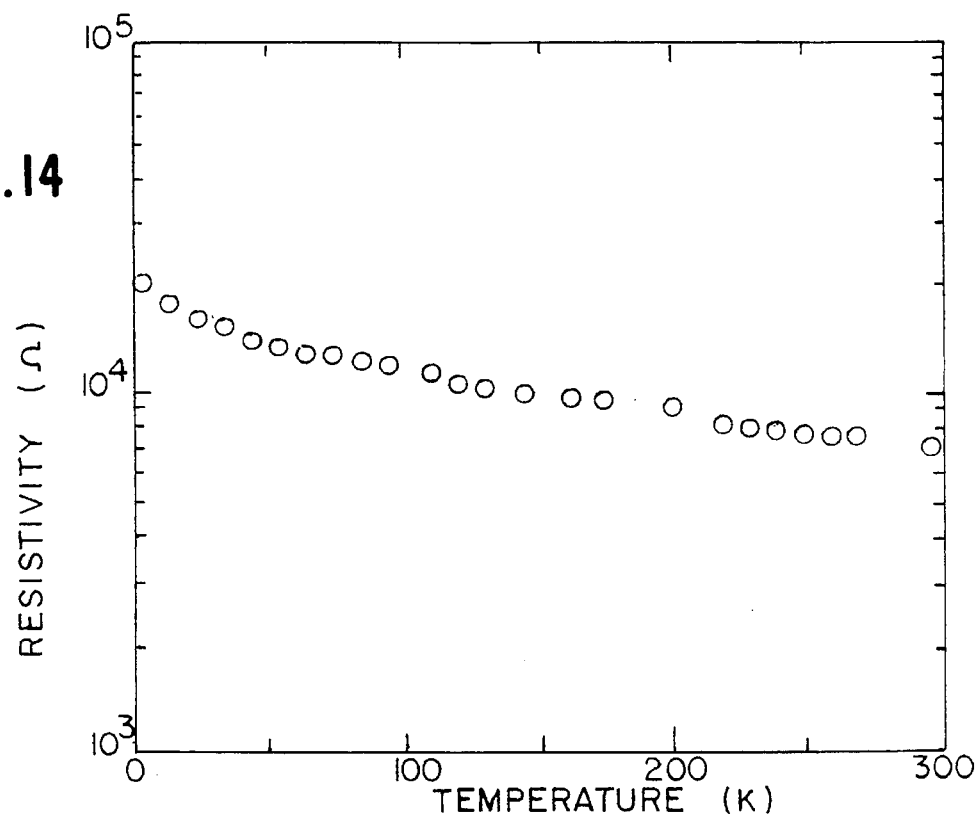
FIG. 14 is a graph of resistivity ($\Omega$) vs. temperature of the device obtained in Example 5.

Temperature dependency of electrical resistance of $C_{60}$/In layer 31 of the device of Example 5 was determined in a temperature range of from 5 to 300 K. The results obtained are shown in FIG. 14. It was confirmed that the device exhibits the character of a semiconductor, retaining a resistivity on the order of $k\Omega$ even at 5 K. The change in resistivity observed was reversible in a temperature rise and in a temperature fall. It can be understood that protective film 4 suffered from no cracks at such a very low temperature around the liquid helium temperature so that oxygen and water of the atmosphere were inhibited from permeating into carbon cluster superconducting film 3.

EXAMPLE 6

A quarts glass substrate having a dimension of 10 mm×10 with a thickness of 0.5 mm having previously formed thereon four gold electrodes was set on the susceptor of the MBE deposition apparatus of FIG. 8. To each of the gold electrode was connected a terminal of an electric resistance measuring apparatus according to a four-terminal network method which was placed out of the deposition apparatus. $C_{60}$ powder, an Rb alkali dispenser and silicon were put in the molecular beam sources, respectively. The molecular beam sources for $C_{60}$ and Rb had a resistive heating element composed of a Knudesen cell, and that for Si had an electron bombardment heating element composed of an electron gun.

The chamber was evacuated to a degree of vacuum of $10^{-7}$ to $10^{-8}$ Torr, and carbon cluster $C_{60}$ was evaporated from the molecular beam source to deposit on the substrate at 100° C. a layer composed of $C_{60}$ only having a thickness of 200 nm. The evaporation of $C_{60}$ was then stopped, and Rb was evaporated to deposit where the temperature of the substrate was 70° C. Upon deposition of $C_{60}$ and Rb, the resistivity of between the four gold electrodes was monitored. The evaporated Rb was dispersed into the $C_{60}$ layer in a gas phase to accomplish doping with Rb. The composition of the superconductive Rb-doped $C_{60}$ was $Rb_3C_{60}$ at which composition, the resistivity showed the minimum value. Upon doping of Rb, the evaporation of Rb was stopped when the resistivity showed the minimum value 20 $\Omega$.

Figure 15:
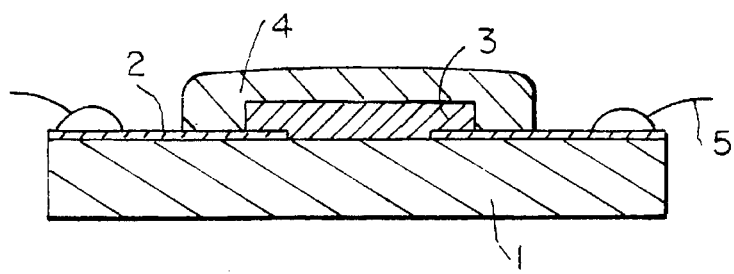
FIG. 15 illustrates a cross section of a device produced in Example 6.

The shutter for the Si source was opened to evaporate Si. There was thus deposited a silicon protective film to a thickness of 500 nm with which the superconducting $Rb_3C_{60}$ film was covered. The resulting device had a cross section as shown in FIG. 15. In FIG. 15, numeral 1 denotes the substrate, 2 denotes the gold electrode, 3 denotes the superconducting $Rb_3C_{60}$ film, 4 denotes the silicon protective film, and 5 denotes a wiring connected to the resistance measuring apparatus.

The resulting device was analyzed by Auger electron spectroscopy. The profile pattern obtained proves that the superconducting layer has a superconducting composition of $Rb_3C_{60}$.

Figure 16:
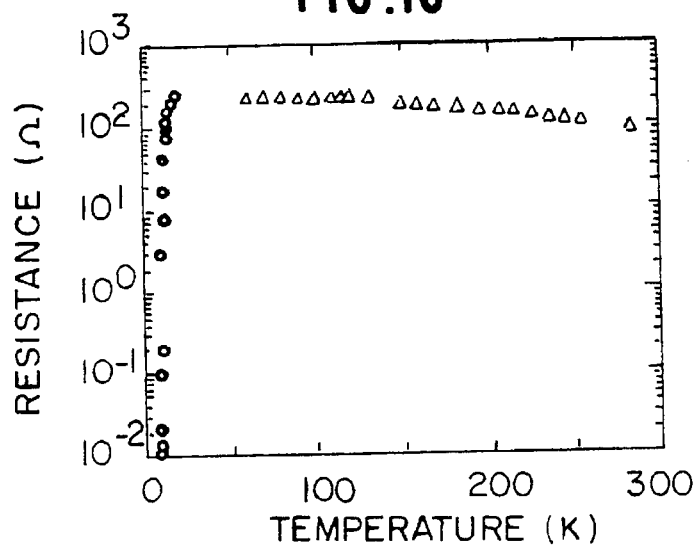
FIG. 16 is a graph of resistivity ($\Omega$) vs. temperature of the device obtained in Example 6 before exposure to the atmosphere.

Temperature dependency of electrical resistance of the superconducting layer of the device was determined. The results obtained are shown in FIG. 16. It was confirmed that the device exhibited transfer to superconducting state at Tc (on set) of 24 K and Tc (end) of 10 K.

Figure 17:
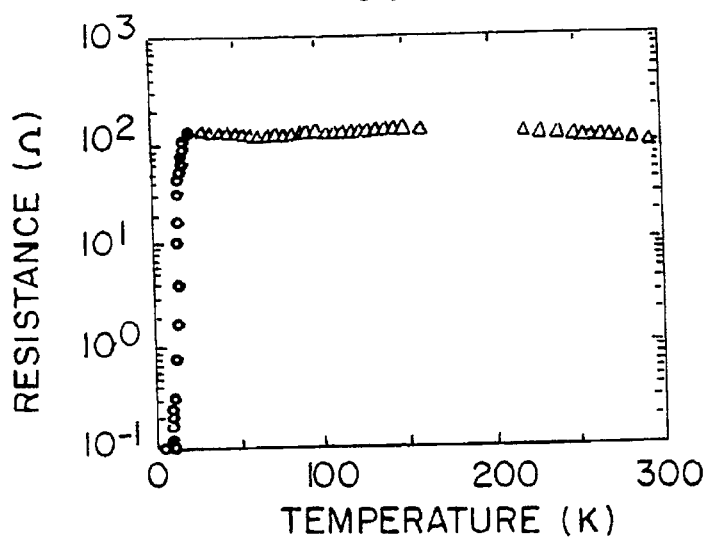
FIG. 17 is a graph of resistivity ($\Omega$) vs. temperature of the device obtained in Example 6 after exposure to the atmosphere.

The device was then exposed to the atmosphere for 220 minutes with the resistivity measurement being continued. The resistivity was increased only 1.3 times the initial value. Temperature dependence of electrical resistance of the superconducting layer of the device was again determined. The results obtained are shown in FIG. 17. It was confirmed that the device still exhibited the superconducting transition at Tc (on set) of 24 K and Tc (end) of 10 K. Thus, deterioration in superconducting properties of the device due to exposure to the atmosphere was not observed.

For comparison, a device was produced in the same manner as described above, except for forming no protective film. The resistivity began to abruptly increase when exposed to the atmosphere.

These results prove that covering of the carbon cluster film with the protective film effectively prevents permeation of oxygen and water of the atmosphere into the carbon cluster film to improve the stability of the device in the atmosphere.

EXAMPLE 7

Figure 18:
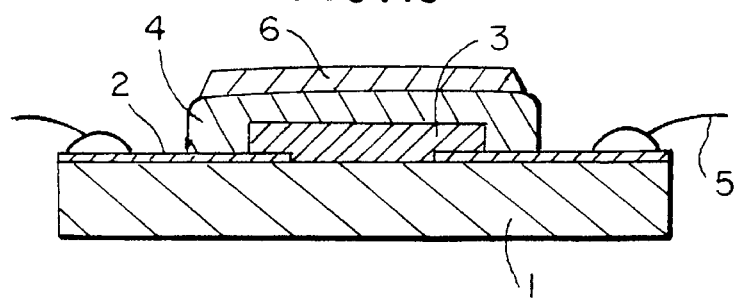
FIG. 18 illustrates a cross section of a device produced in Example 7.

The same procedures as in Example 6 were repeated to form a device composed of a substrate having thereon an Rb-doped $C_{60}$ film covered with an Si protective film. An Al protective film was further formed on the Si protective film by evaporating from a molecular beam source having an electron bombardment heating element. The resulting device had a cross section as shown in FIG. 18. In FIG. 18, numeral 1 denotes the substrate, 2 denotes the gold electrode, 3 denotes the superconducting $Rb_3C_{60}$ film, 4 denotes the silicon protective film, 5 denotes a wiring connected to the resistance measuring apparatus, and 6 denotes the Al protective film.

Figure 19:
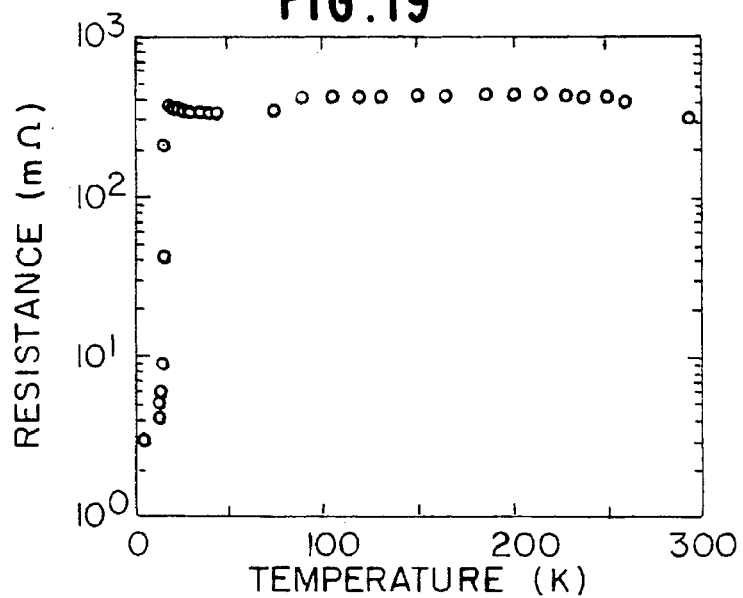
FIG. 19 is a graph of resistivity ($\Omega$) vs. temperature of the device obtained in Example 7 before exposure to the atmosphere.
Figure 20:
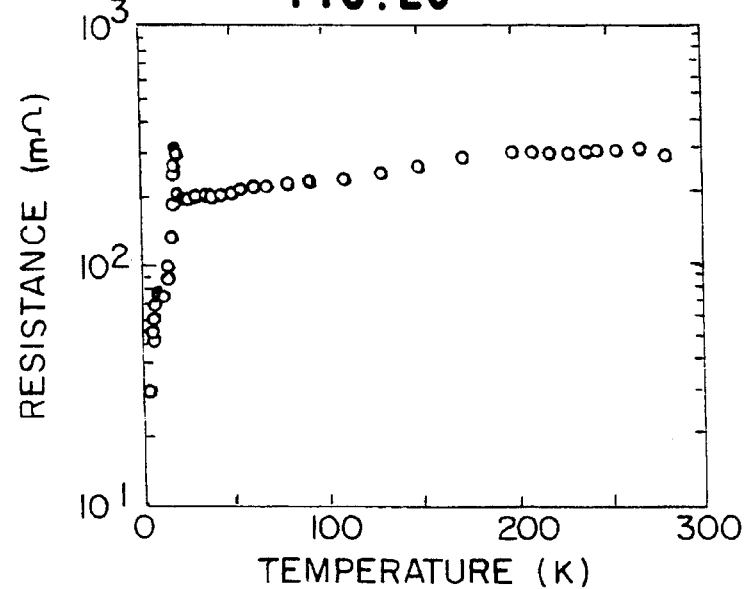
FIG. 20 is a graph of resistivity ($\Omega$) vs. temperature of the device obtained in Example 7 after exposure to the atmosphere.

Temperature dependence of electrical resistance of the superconducting layer of the device was determined. The results obtained are shown in FIG. 19. The device was exposed to the atmosphere for 8 hours and temperature dependence of electrical resistance was again determined. The results of obtained are shown in FIG. 20. It was confirmed from the results in FIGS. 19 and 20 that the device exhibited the superconducting transition at Tc (on set) of 18 K even after exposure to the atmosphere for 8 hours.

These results prove that the provision of the Al protective film further improves the stability of the device in the atmosphere.

While $C_{60}$ was used as a carbon cluster in the foregoing Examples, it does not mean exclusion of use of carbon cluster $C_{70}$ in place of $C_{60}$.

As described and demonstrated above, the device according to the present invention prevents a dopant, such as an alkali metal or indium in the carbon cluster film, from reacting with oxygen or water in the atmosphere and therefore retains satisfactory conductivity or superconductivity for an extended period of time.

According to the process for producing the device of the present invention, since a carbon cluster film and a protective film can be formed in a continuous vacuum line, the carbon cluster film is never brought into contact with the atmosphere during the production. In addition, the protective film formed in vacuo is so denseness that reliability in preventing oxygen or water from permeating into the carbon cluster film and in retaining satisfactory superconductivity.

Further, by using an insulating material having a coefficient of thermal expansion ranging from $1\times10^{-6}/°C$. to $5\times10^{-6}/°C$. as the above-mentioned protective film, the durability of the protective film against thermal shocks can be improved to prevent cracking. Permeation of oxygen or water can thus be prevented with certainty to thereby further improve retention of superconductivity. For example, Si has a coefficient of thermal expansion of $2.6\times10^{-6}/°C$., which is very close to that of $In_xC_{60}$, i.e., $3\times10^{-6}/°C$. Therefore, protective film 4 comprising Si has a coefficient of thermal expansion substantially equal to that of carbon cluster film 3, from which it is understood that the device exhibits sufficient durability against thermal shocks.

Further, since gold electrodes 2 extend out of protective film 4, terminals for, for example, testing of electrical characteristics can be connected to these gold electrodes 2 in the atmosphere without causing deterioration of carbon cluster superconducting film 3.

While the invention has been described in detail and with reference to specific examples thereof, it will be apparent to one skilled in the art that various changes and modifications can be made therein without departing from the spirit and scope thereof.

What is claimed is:

1. A device comprising a substrate having thereon, (1) a film of a conducting or superconducting carbon cluster comprising (a) $C_{60}$ or (b) a $C_{60}/C_{70}$ mixture, each of (a) and (b) being doped with at least one dopant selected from the group consisting of Group I elements, Group II elements, Group III elements, and Group IV elements, covered with (2) a protective film capable of substantially preventing permeation of oxygen and water from the atmosphere, wherein said protective film (2) comprises an insulator having a thermal expansion coefficient ranging from $1\times10^{-6}/°C$. to $5\times10^{-6}/°C$., wherein said device further comprises (3) a non-doped carbon cluster film between said film (1) and said protective film (2), wherein said insulator is selected from the group consisting of silicon, silicon dioxide, silicon nitride, diamond, amorphous carbon, and boron nitride, and wherein said protective film (2) has a thickness of from 0.1 μm to 10 μm.

2. The device as claimed in claim 1, wherein said dopant is selected from the group consisting of an alkali metal, an alkaline earth metal, a noble metal, In, and Sn.

3. The device as claimed in claim 2, wherein said dopant is In.

* * * * *